(12) United States Patent
Patel et al.

(10) Patent No.: US 6,278,604 B1
(45) Date of Patent: Aug. 21, 2001

(54) CAPACITOR WITH CELL BALANCING CIRCUIT

(75) Inventors: Hitendra K. Patel, Palatine, IL (US); Jason N. Howard, Lawrenceville, GA (US); Richard H. Jung, Park Ridge, IL (US)

(73) Assignee: Motorola Inc, Schaumburg, IL (US)

( * ) Notice: Subject to any disclaimer, the term of this patent is extended or adjusted under 35 U.S.C. 154(b) by 0 days.

(21) Appl. No.: 08/992,483

(22) Filed: Dec. 18, 1997

(51) Int. Cl.⁷ ............................. H01G 9/004; H01G 5/38
(52) U.S. Cl. ................ 361/502; 361/503; 361/522; 361/517; 29/25.03
(58) Field of Search ............................ 365/154, 174; 429/194, 198; 361/525, 502, 500, 503, 504, 508, 509, 510, 516, 517, 522–527, 528, 529, 534, 535

(56) References Cited

U.S. PATENT DOCUMENTS

| | | | |
|---|---|---|---|
| 3,652,902 | * 3/1972 | Hart et al. | 361/500 |
| 5,428,501 | * 6/1995 | Bruder | 361/535 |
| 5,469,325 | * 11/1995 | Evans | 361/526 |
| 5,529,971 | * 6/1996 | Kaschmitter et al. | 502/416 |
| 5,555,155 | * 9/1996 | Patel et al. | 361/503 |
| 5,583,415 | 12/1996 | Fernandez et al. | 320/15 |
| 5,714,053 | * 2/1998 | Howard | 205/220 |

\* cited by examiner

Primary Examiner—Kristine Kincaid
Assistant Examiner—Eric W. Thomas
(74) Attorney, Agent, or Firm—Felipe J Farley; Philip H. Burrus, IV

(57) ABSTRACT

A multiple cell capacitor (200) includes at least first and second capacitor cells (260) and a cell balancing circuit (265) electrically coupled to the first and second capacitor cells (260). Packaging material (280) encloses the first and second capacitor cells (260) and the cell balancing circuit (265). The cell balancing circuit (265) can include, for each capacitor cell (260), a resistor (265) formed electrically in parallel with that capacitor cell (260).

10 Claims, 4 Drawing Sheets

CAPACITOR WITH CELL BALANCING CIRCUIT

TECHNICAL FIELD

This invention relates in general to capacitors, and more specifically to cell balancing of capacitors.

BACKGROUND

Capacitors, such as electrochemical capacitors, generally include outer substrates that are electrically conductive. Inner surfaces of the substrates are coated with electroactive material to form electrodes between which an electrolyte is sandwiched to form a capacitor. A capacitor including a single electrolyte layer between electroactive layers is often referred to as a single-cell capacitor.

Capacitors can also include multiple cells that are connected in series to obtain a higher voltage device. Each cell in the series stack is constructed from an electrolyte sandwiched between electroactive material. The multiple cells are separated by one another by electrically conductive substrates. However, such multiple-cell capacitors can be damaged if operated at or close to the rated capacitor voltage for times greater than the time constant of the cell with the highest leakage current, i.e., the most lossy cell, in a capacitor stack. The voltage over the lossy cell decreases and, as a result, the voltages over the other cells increase to maintain the applied (supply) voltage. This higher voltage can damage the cells and cause instabilities arising due to variations in the leakage current and/or leakage resistance between cells in the multi-cell capacitor.

Thus, what is needed is a way to balance cells within a multiple cell capacitor to prevent occurrences of voltage variation and device instability.

DETAILED DESCRIPTION OF THE PREFERRED EMBODIMENT

Figure 1:
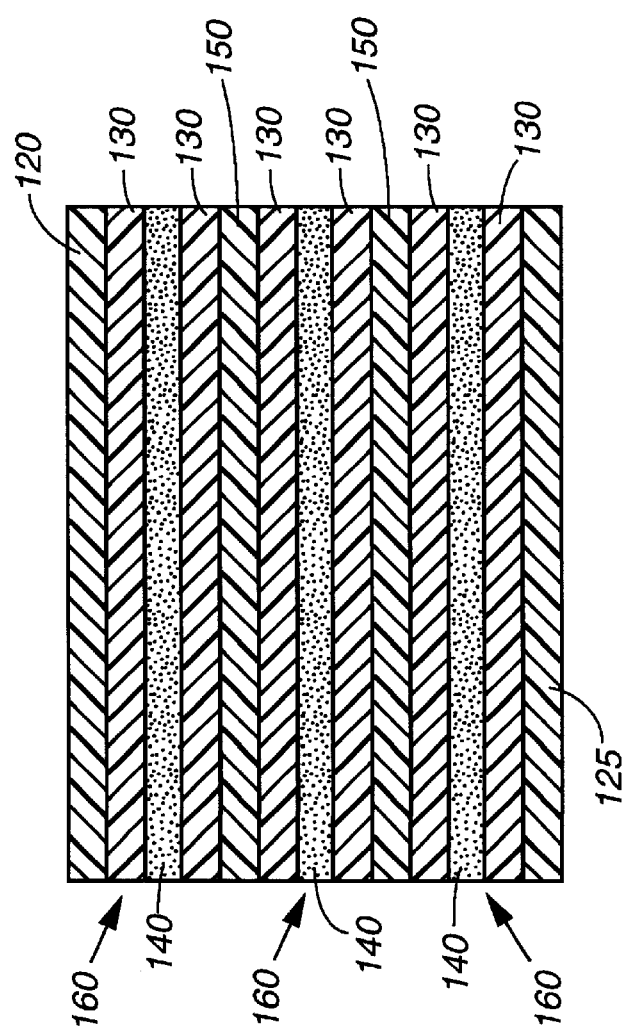
FIG. 1 is a side view of a conventional multi-cell capacitor.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a conventional multiple cell (multi-cell) capacitor 100 is illustrated. The capacitor 100 includes a number of capacitor cells 160 that are stacked to form the capacitor 100. More specifically, each cell 160 includes an electrolyte layer 140 positioned between two layers of electroactive material 130. Within the multi-cell capacitor 100, an inner conductive substrate 150 is located between every two cells 160 to form a multi-cell capacitor sub-assembly. The sub-assembly is then positioned between outer conductive substrates 120, 125 to complete assembly of the multi-cell capacitor 100.

Figure 2:
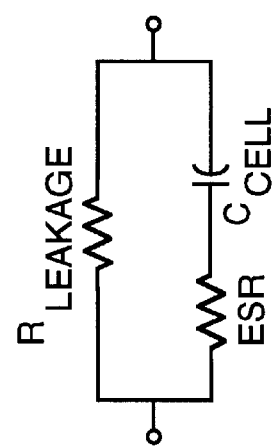
FIG. 2 is a circuit diagram illustrative of electrical components of a cell of the conventional multi-cell capacitor of FIG. 1.

FIG. 2 is a circuit diagram that approximates a capacitor cell, such as any of the cells 160. As shown, electrical components of a capacitor cell include $C_{cell}$, the capacitance of the cell, and an equivalent series resistance (ESR) in series with $C_{cell}$. The leakage resistance, $R_{leakage}$, of the cell operates in parallel with the series combination of ESR and $C_{cell}$. The conventional multi-cell capacitor 100 becomes unstable if operated at the rated voltage for times greater than the time constant, which equals $R_{leakage} \times C_{cell}$, of the most lossy cell 160 in the capacitor stack. This long time instability arises due to variations in the leakage resistance between cells. Prior research efforts have tended to focus on balancing the capacitance and ESR in each cell.

On applying a voltage to a capacitor stack, such as the multi-cell capacitor 100, current surges into the capacitor to charge each cell. The voltage uniformly distributes over each cell as long as the capacitance and ESR for each cell are similar. After a relatively long period of time, e.g., $5R_{leakage,\,cell} \times C_{cell}$, the current supplied by the power source to the capacitor will decrease to a finite value defined as the leakage current of the device. Since direct current (DC) cannot go through a capacitor, a resistive path in parallel to each cell exists, and this resistive path is referred to as the leakage resistance. The product of the leakage current and the leakage resistance of each cell determines the voltage over the resistor, which is equal to the voltage over the capacitor cell. Consequently, for long times, higher potentials exist across cells with high leakage resistance, and lower potentials exist across cells with low leakage resistance. If the distribution in values for the leakage resistance is not within some tolerance limit, then the potentials over some of the high leakage resistance cells may approach the electrolyte decomposition voltage and cause the cell to fail, which then causes cascade failure of other cells in the multi-cell capacitor.

One method that can be used to solve the problem of cell balancing is to derate each capacitor cell to a lower voltage, such as 0.7 volts/cell rather than 1.2 volts/cell, and then to stack the appropriate number of cells to achieve the necessary voltage. However, the number of cells needed to obtain the required voltage is increased. Penalties of this approach include: (1) lower capacitance per square centimeter; (2) higher ESR per square centimeter; (3) larger surface area, thus size, for the device; (4) greater material usage that results in greater device cost; (5) lower device reliability; (6) lower device energy and power density; and (7) tighter parameter constraints during manufacturing. With these disadvantages in mind, it can be seen that using a capacitor cell at or close to its maximum rated voltage is highly desirable.

Figure 3:
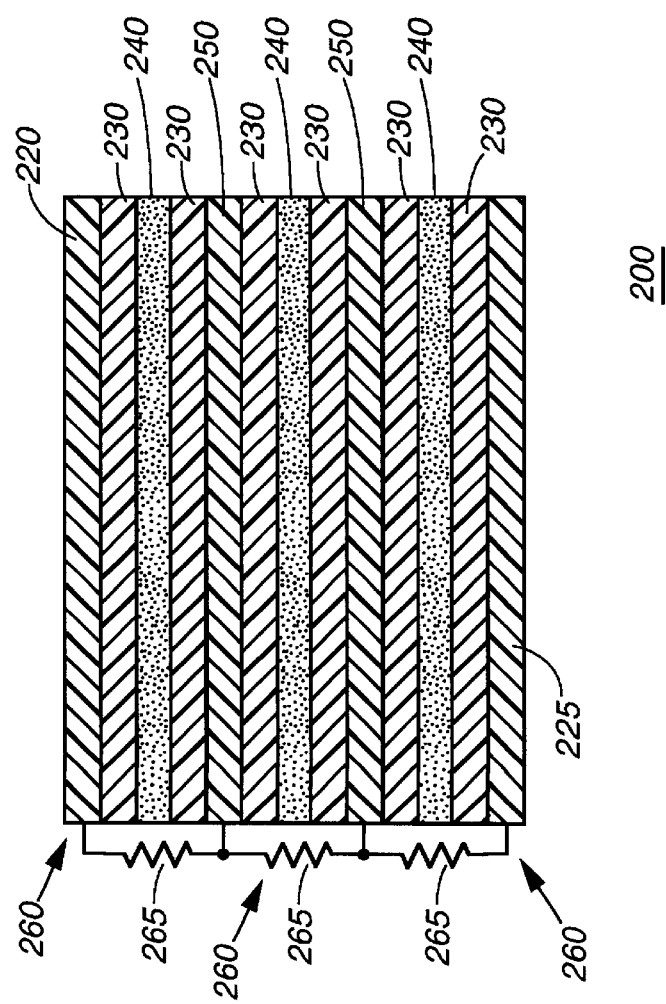
FIG. 3 is a side view of a multi-cell capacitor having a cell balancing circuit according to the present invention.

Referring next to FIG. 3, a multi-cell capacitor 200 according to the present invention is depicted. The multi-cell capacitor 200 includes at least two capacitor cells 260, each including an electrolyte layer 240 sandwiched between electroactive material layers 230. Electrically conductive substrates 250 are located between each capacitor cell 260, and outer conductive substrates 220, 225 are positioned at outer opposing surfaces of the multi-cell sub-assembly.

The substrates 220, 225, 250, the electrolyte 240, and the electroactive material 230 can be manufactured from materials that are typically used for forming capacitors. By way of example, the processes and materials used to construct the capacitive portions of the capacitor 200 can be, for instance, those disclosed in commonly assigned U.S. Pat. No. 5,568,353 issued Oct. 22, 1996 to Bai et al., entitled "ELECTROCHEMICAL CAPACITOR AND METHOD OF MAKING SAME", the teachings of which are hereby incorporated by reference. More specifically, the substrates 220, 225, 250 can be formed from titanium, aluminum, or other electrically conductive materials, and the electroactive material 230 can comprise a metal oxide, such as ruthenium oxide. The electrolyte 240 could, for instance, comprise a polyacid electrolyte.

According to the present invention, the multi-cell capacitor 200 according to the present invention solves the problem of cell balancing by introducing a controlled, equivalent amount of additional leakage resistance 265 to each capacitor cell 260. In other words, the multi-cell capacitor 200 includes an integral cell balancing circuit comprising at least one electrical component per cell 260.

As shown in FIG. 3, the cell balancing circuit can include a number of resistors 265 equal to the number of capacitor cells 260 within the multi-cell capacitor 200. Each resistor 265 is electrically connected in parallel with a single cell 260 to introduce an additional amount of leakage resistance. The resistors 265 can be discrete components that are electrically coupled, such as by soldering, to the substrates 250 positioned about the particular capacitor cells 260 or that are printed on edges or bodies of the capacitor cells. Alternatively, the resistors 265 could comprise materials that function as resistors, as will explained in greater detail below, and that are already included as components of the capacitor cells. For instance, standoffs, sealants, or gaskets could be doped with an electrically conductive filler material, or an existing electrolyte system could include conductive filer material dispersed therein. The cell balancing circuit could also include different electrical components, such as discrete diodes, instead of resistors to balance the cells 260. What is important is that the cell balancing circuit is included as an integral part of the multi-cell capacitor 200, as shown in FIG. 4.

Figure 4:
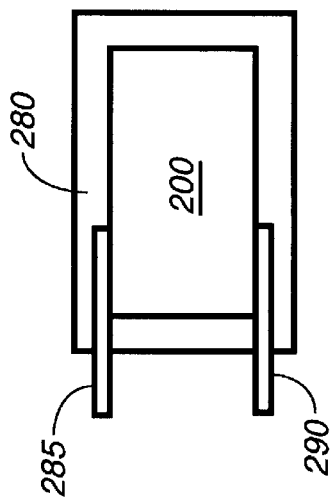
FIG. 4 is a side view of a packaged capacitor including the multi-cell capacitor of FIG. 3.

FIG. 4 illustrates the capacitor 200 encapsulated by packaging material 280, such as a foil laminate. According to the present invention, the cell balancing circuit (not shown in FIG. 4) is also enclosed by any packaging material 280 used to house the capacitor 200. If desired, positive and negative contacts 285, 290, which are electrically coupled to the capacitor 200, can extend through the packaging material 280 to provide electrical interconnects to the capacitor 200.

Figure 5:
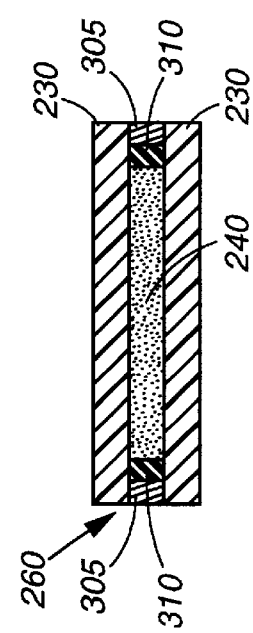
FIG. 5 is a side view of a single capacitor cell including a first cell balancing circuit according to the present invention.

As mentioned above, any method for introducing a controlled amount of parallel resistance into the cell 260 can be used. FIG. 5 illustrates a single capacitor cell 260 in which resistance has been introduced by means other than a discrete electrical component. In the example of FIG. 5, the cell 260 comprises an electrolyte 240 positioned between two electroactive layers 230 as well as resistive components 305, 310 that are coupled to the electroactive material 230. The resistive components of this example include an "o" ring or stand-off ring, sealant, or other resistive material 305 and an optional insulator 310 for electrically isolating the ring or sealant 305 from the electrolyte 240. A sealant could, for instance, be made from a polymer, ceramic, glass, or combination thereof, and resistive material dispersed therein could be ruthenium, ruthenium oxide, carbon, nickel alloys or compounds, or other electrically conductive materials. When the resistive material is in contact with the electrolyte, it should also be resistant thereto.

Figure 6:
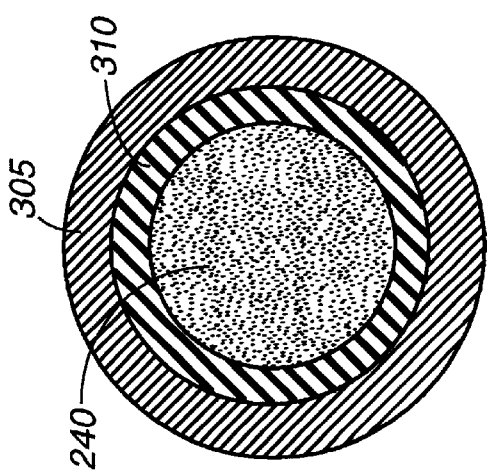
FIG. 6 is a top view of the single capacitor cell of FIG. 5 according to the present invention.

Referring next to FIG. 6, a top view of a portion of the cell 260 of FIG. 5 is shown without the top electroactive layer. In this view, it can be seen that the ring or sealant 305 is positioned around the perimeter of the cell 260 and can be separated from the electrolyte 240 by the electrically insulative material 310. It will be appreciated that use of this type of cell balancing component between the electroactive layers 230 not only adds a controlled amount of resistance but also mechanically strengthens the cell 260.

Figure 8:
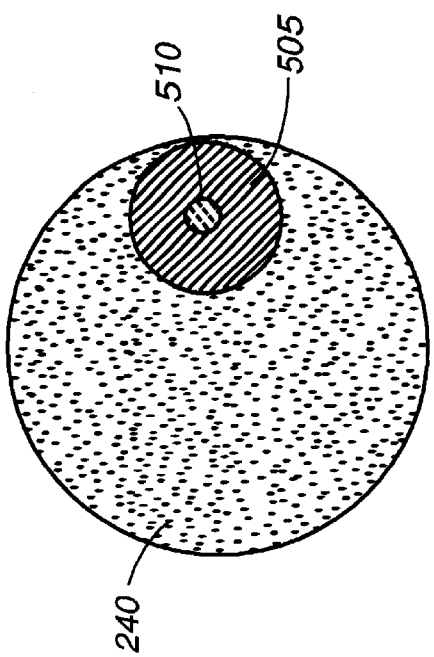
FIG. 8 is a top view of the single capacitor cell of FIG. 7 according to the present invention.
Figure 7:
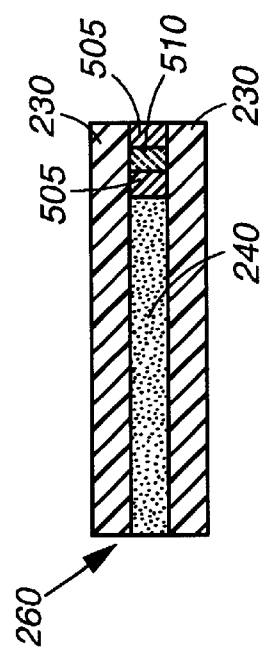
FIG. 7 is a side view of a single capacitor cell including a second cell balancing circuit according to the present invention.

FIG. 7 is a side view of a single capacitor cell 260 that includes a different cell balancing component. In particular, the cell 260 includes an electrically insulative spacer 505 in combination with a resistive element 510, such as resistive ink plated onto a core material. FIG. 8 shows a top view of a portion of the cell 260 including the spacer 505 and resistive element 510. As shown, the spacer 505 electrically insulates the resistive element 510 from the electrolyte 240. It will be appreciated that the spacer 505 and the resistive element 510 could be positioned differently within the cell 260. For instance, the cell balancing components 505, 510 could be located in a central location between the electroactive layers 230.

A balance between the amount of leakage resistance material added and the amount of electrolyte displaced should be considered. The capacitor cell 260 becomes more lossy and the ionic resistance increases as the cross-sectional electrolyte area decreases since, as more leakage material is added, more surface area for ionic conduction is eliminated. Therefore, it is preferable that no more than 10% of the electrolyte material be displaced.

In order to illustrate improved performance of a capacitor using the cell balancing circuit of the present invention, a power supply was used to apply a DC voltage to a multi-cell capacitor formed from two single cell capacitors connected in series. The capacitor cells were fabricated using polyvinylalcohol (PVA) electrolyte systems with ruthenium oxide electroactive material. Each capacitor cell had a capacitance of 0.2 Farads (F) and an ESR of 0.12 ohms ( ), and the voltage tolerance for each cell was considered to be 1.2 volts (V). The leakage resistance for the first cell was 5 k, and the leakage resistance for the second cell was 2.8 k. In three separate experiments, carbon resistors of 122, 466, and 1000, respectively, were placed in parallel with each cell and tested sequentially at source voltages of about 1.5 V, 2.0V, and 2.2V. Results are shown in the below Tables 1–3 and FIG. 9.

TABLE 1

NO RESISTOR IN PARALLEL

| Applied V | C1 voltage | % diff. from C2 | C2 voltage | % diff. from C1 |
|---|---|---|---|---|
| 1.51 | 0.97 | 64% | 0.54 | 36% |
| 2.01 | 1.23 | 61% | 0.78 | 39% |
| 2.20 | 1.32 | 60% | 0.88 | 40% |

TABLE 2

ADDITIONAL RESISTANCE OF 1000

| Applied V | C1 voltage | % diff. from C2 | C2 voltage | % diff. from C1 |
|---|---|---|---|---|
| 1.51 | 0.92 | 61% | 0.59 | 39% |
| 2.01 | 1.13 | 56% | 0.88 | 44% |
| 2.20 | 1.21 | 55% | 0.99 | 45% |

TABLE 3

ADDITIONAL RESISTANCE OF 466

| Applied V | C1 voltage | % diff. from C2 | C2 voltage | % diff. from C1 |
|---|---|---|---|---|
| 1.51 | 0.79 | 52% | 0.72 | 48% |
| 2.01 | 1.03 | 51% | 0.99 | 49% |
| 2.20 | 1.13 | 51% | 1.07 | 49% |

TABLE 4

ADDITIONAL RESISTANCE OF 122

| Applied V | C1 voltage | % diff. from C2 | C2 voltage | % diff. from C1 |
|---|---|---|---|---|
| 1.51 | 0.77 | 51% | 0.75 | 49% |
| 2.01 | 1.03 | 51% | 0.98 | 49% |
| 2.20 | 1.13 | 51% | 1.07 | 49% |

Figure 9:
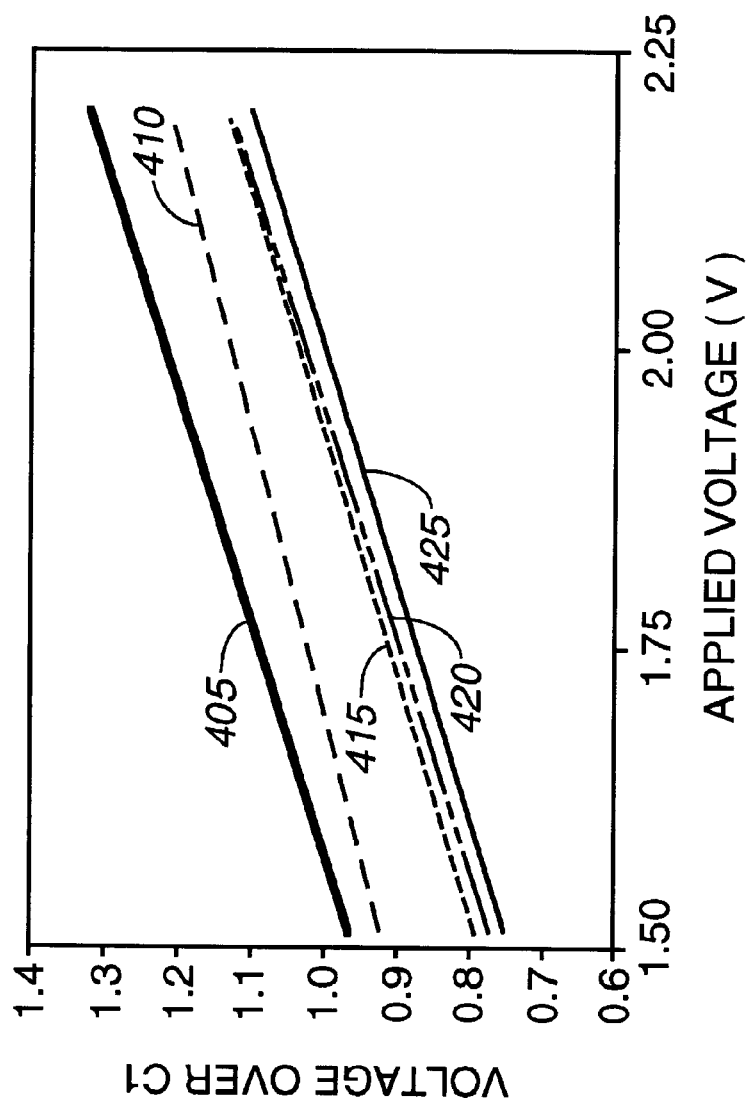
FIG. 9 is a diagram of applied voltage versus voltage difference for different resistor values.

In FIG. 9, curve 405 represents voltage deviation for a situation in which no resistors are placed in parallel with the capacitor cells, curve 410 corresponds to a parallel resistance of 1000, curve 415 corresponds to a parallel resistance of 466, and curve 420 corresponds to a parallel resistance of 122. An ideal voltage deviation is represented by curve 425.

As can be seen, the voltage differences between the two capacitor cells are largest for the case where no resistors are added in parallel. A source voltage of 2V causes the first cell voltage to exceed 1.2V, and application of 2.2V causes the first cell to go to 1.32V. Therefore, the cells are limited to less than 1V/cell in this case.

Adding resistors in parallel markedly improves the voltage distribution between the two capacitor cells. The voltage variation decreases as the value of the added parallel resistor also decreases. In fact, the voltage distributes over each cell almost equally for resistor values of 466 or less. As a result, the two cell capacitor stack can have an operating rating greater than 2.2V, i.e., greater than 1.1V/cell, as compared to 2V for the setup with no resistors in parallel. Decreasing the resistor value from 466 to 122 shows limited improvement in the voltage distribution. This result suggests that added leakage resistance to the cell should have resistor values of approximately 20% of the leakage resistance of the lossiest cell.

In summary, the multi-cell capacitor as described above includes a number of capacitor cells stacked in series. Additionally, the multi-cell capacitor includes, within the same package, a cell balancing circuit comprising an electrical component, preferably a resistive element, in parallel with each capacitor cell. The introduction of a controlled, parallel resistance for each cell balances the cells within the capacitor without requiring external components to be purchased or designed into a circuit by the capacitor purchaser. At the same time, the capacitor according to the present invention can be relatively small in size, inexpensive, and simpler to manufacture than conventional multi-cell capacitors.

The cell balancing circuitry for each capacitor cell can comprise a discrete resistor or diode connected in parallel with the cell. Alternatively, the cell balancing circuitry can include resistive components that are actually manufactured as a part of the capacitor cell itself. For instance, sealants or resistive ink can be connected to both layers of electroactive material and electrically insulated from the electrolyte by insulative material.

It will be appreciated by now that there has been provided an improved way to perform cell balancing in a multiple cell capacitor.

What is claimed is:

1. A capacitor, comprising:

capacitor cells; and a cell balancing circuit electrically coupled to the capacitor cells; and packaging material for enclosing the capacitor cells and the cell balancing circuit;

wherein each capacitor cell comprises:
first and second layers of electroactive material; and
an electrolyte positioned between the first and second layers;
wherein a conductive substrate is positioned between every two capacitor cells;
wherein the cell balancing circuit comprises at least one electrical component coupled to each capacitor cell;
wherein said at least one electrical component is electrically coupled between the first and second layers of electroactive material.

2. The capacitor of claim 1, wherein the at least one electrical component comprises:

a sealant positioned between the first and second layers of electroactive material; and an insulator positioned between the sealant and the electrolyte.

3. The capacitor of claim 1, wherein the at least one electrical component comprises:

a sealant positioned between the first and second layers of electroactive material; and a stand-off ring positioned between the first and second layers of electroactive material; and an insulator positioned between the sealant and the electrolyte.

4. The capacitor of claim 1, wherein the at least one electrical component comprises:

resistive material positioned between the first and second layers of electroactive material; and an insulator positioned between the resistive material and the electrolyte.

5. The capacitor of claim 1, wherein the at least one electrical component comprises:

electrically conductive filler material dispersed within the electrolyte.

6. A capacitor, comprising:

first and second capacitor cells; and a cell balancing circuit electrically coupled to the first and second capacitor cells; and packaging material for enclosing the first and second capacitor cells and the cell balancing circuit;

wherein each of the first and second capacitor cells comprises:
first and second layers of electroactive material; and
an electrolyte positioned between the first and second layers;

wherein the cell balancing circuit comprises a first resistor in parallel with the first capacitor cell and a second resistor in parallel with the second capacitor cell;

wherein the first resistor is electrically coupled between the first and second layers of electroactive material of the first capacitor cell.

7. A capacitor, comprising:

first and second capacitor cells; and a cell balancing circuit electrically coupled to the first and second capacitor cells; and packaging material for enclosing the first and second capacitor cells and the cell balancing circuit;

wherein each of the first and second capacitor cells comprises:
  first and second layers of electroactive material; and
  an electrolyte positioned between the first and second layers;
  wherein the cell balancing circuit comprises a first resistor in parallel with the first capacitor cell and a second resistor in parallel with the second capacitor cell;
  wherein the second resistor is electrically coupled between the first and second layers of electroactive material of the second capacitor cell.

8. A capacitor, comprising:

first and second capacitor cells; and a cell balancing circuit electrically coupled to the first and second capacitor cells; and packaging material for enclosing the first and second capacitor cells and the cell balancing circuit;

wherein each of the first and second capacitor cells comprises:
  first and second layers of electroactive material; and
  an electrolyte positioned between the first and second layers;
  wherein the first resistor comprises:
    a sealant positioned between the first and second layers of electroactive material of the first capacitor cell; and
    an insulator positioned between the sealant and the electrolyte of the first capacitor cell.

9. A capacitor, comprising:

first and second capacitor cells; and a cell balancing circuit electrically coupled to the first and second capacitor cells; and packaging material for enclosing the first and second capacitor cells and the cell balancing circuit;

wherein each of the first and second capacitor cells comprises:
  first and second layers of electroactive material; and
  an electrolyte positioned between the first and second layers;
  wherein the first resistor comprises:
    resistive material positioned between the first and second layers of electroactive material of the first capacitor cell; and
    an insulator positioned between the resistive material and the electrolyte of the first capacitor cell.

10. A capacitor, comprising:

first and second capacitor cells; and a cell balancing circuit electrically coupled to the first and second capacitor cells; and packaging material for enclosing the first and second capacitor cells and the cell balancing circuit;

wherein each of the first and second capacitor cells comprises:
  first and second layers of electroactive material; and
  an electrolyte positioned between the first and second layers;
  wherein the resistor comprises:
    a sealant positioned between the first and second layers of electroactive material of the first capacitor cell; and
    a stand-off ring positioned between the first and second layers of electroactive material of the first capacitor cell; and
    an insulator positioned between the sealant and the electrolyte of the first capacitor cell.

* * * * *

UNITED STATES PATENT AND TRADEMARK OFFICE
CERTIFICATE OF CORRECTION

PATENT NO. : 6,278,604 B1                                                    Page 1 of 1
DATED       : August 21, 2001
INVENTOR(S) : Patel et al.

It is certified that error appears in the above-identified patent and that said Letters Patent is hereby corrected as shown below:

<u>Title page,</u>
Item [75], Inventor(s) line reads "Hitendra K. Patel, Palatine Illinois" should be
-- Hitendra K. Patel, Palantine Illinois; Jason Newton Howard, Lawrenceville Georgia; Richard Hanson Jung, Park Ridge Illinois --.

Signed and Sealed this

Fourteenth Day of May, 2002

Attest:

*Attesting Officer*

JAMES E. ROGAN
*Director of the United States Patent and Trademark Office*